United States Patent [19]

Lohrmann

[11] Patent Number: 5,020,133
[45] Date of Patent: May 28, 1991

[54] PHASE/FREQUENCY MODULATOR

[75] Inventor: Dieter R. Lohrmann, Lanham, Md.

[73] Assignee: The United States of America as represented by the Secretary of the Army, Washington, D.C.

[21] Appl. No.: 369,398

[22] Filed: Jun. 21, 1989

[51] Int. Cl.$^5$ .............................................. H04B 1/00
[52] U.S. Cl. ...................................... 455/43; 455/47; 455/109; 375/61; 332/170
[58] Field of Search ...................... 455/104, 42, 43, 46, 455/47, 118, 102, 108, 109; 375/60, 61; 332/170, 103, 117, 100, 144; 307/490; 328/142, 143

[56] References Cited

U.S. PATENT DOCUMENTS

| | | | |
|---|---|---|---|
| 3,134,855 | 5/1964 | Chasek | 455/46 |
| 3,147,437 | 9/1964 | Crafts et al. | |
| 3,223,928 | 12/1965 | Fayman | 455/118 |
| 3,226,643 | 12/1965 | McNair | 455/46 |
| 3,391,339 | 7/1968 | Lynch | 455/46 |
| 3,546,386 | 12/1970 | Darcey . | |
| 3,714,577 | 1/1973 | Hayes . | |
| 3,729,679 | 4/1973 | Day, Jr. | 455/46 |
| 4,019,140 | 4/1977 | Swerdlow . | |
| 4,079,204 | 3/1978 | Takahashi et al. | 455/102 |
| 4,310,920 | 1/1982 | Hayes . | |
| 4,375,082 | 2/1983 | Lohrmann | 328/178 |
| 4,802,237 | 1/1989 | Covill | 455/108 |
| 4,896,371 | 1/1990 | Kahn | 455/105 |

Primary Examiner—Reinhard J. Eisenzopf
Assistant Examiner—Lisa Charouel
Attorney, Agent, or Firm—Saul Elbaum; Paul S. Clohan; Guy M. Miller

[57] ABSTRACT

Phase or frequency modulators which utilize phase generators rather than phase shifters to produce low frequency input voltages to single side band modulators. Two phase generators are used to supply the two low frequency input ports of a single side band modulator of the 90° phase shift/side band cancellation type, with the voltage dividers of one phase generator being adjusted so that its output is displaced 90° in phase from the output of the other phase generator.

8 Claims, 4 Drawing Sheets

PHASE/FREQUENCY MODULATOR

RIGHTS OF THE GOVERNMENT

The invention described herein may be manufactured, used or licensed by or for the government of the United States of America for governmental purposes without payment to me of any royalities therefor.

BACKGROUND OF THE INVENTION

1. Field of the Invention

The invention relates generally to communications systems, and, more particularly, to a novel frequency or phase modulator system.

2. Description of Related Art Including Information Disclosed Under §§ 1.97-1.99

U.S. Pat. No. 3,147,437, issued Sept. 1, 1964 to Crafts et al discloses a single side band radio carrier retrieval system in which a base band input signal is modulated by a phase shifter which adds or subtracts phase from an existing phase that increases linearly with time.

U.S. Pat. Nos. 3,546,386, issued Dec. 8, 1970 to Darcey and 3,714,577, issued Jan. 30, 1973 to Hayes disclose modulation systems which utilize conventional frequency modulators.

U.S. Pat. Nos. 4,019,140, issued Apr. 19, 1977 to Swerdlow and 4,310,920, issued Jan. 12, 1982 to Hayes disclose single side band radio systems which utilize conventional phase and amplitude modulators.

U.S. Pat. No. 4,375,082, issued Feb. 22, 1983 to Lohrmann, which is incorporated herein by reference, discloses a high speed rectangular function generator for generating a rectangular output voltage in response to a varying input voltage. A voltage divider produces switching points in conjunction with the input voltage to switch inversion and non-inversion amplifiers, and the amplifier outputs are summed to produce a rectangular output voltage.

SUMMARY OF THE INVENTION

It is a primary object of the invention to provide a frequency or phase modulator system in which the radio frequency carrier is modulated directly with no carrier offset and no reduction of carrier frequency stability.

It is another object of the invention to provide a simple system for generating orthogonal modulating signals for the inputs of a single side band modulator of the 90° phase shift/side band cancellation type.

It is a further object of the invention to provide a frequency or phase modulator system which will accomodate an extremely wide bandwidth of the modulating signal.

In the invention described herein, a phase generator similiar to the rectangle function generator described in the above-referenced U.S. Pat. No. 4,375,082 generates an output signal to directly modulate an r. f. carrier signal in either a frequency or phase modulation system. The output signal of this phase generator has a phase which is function of the amplitude of the input signal to the phase generator.

In a phase modulation system, the input signal to the phase generator is the modulation signal. In a frequency modulation system, the modulation signal is processed by a pre-emphasis circuit which emphasizes the low frequencies of the modulation signal, before being supplied to the phase generator, thus creating frequency modulation out of phase modulation.

Two of these phase generators, having the same input signal, can be used to generate output signals which are 90° out of phase merely by shifting the potential of the voltage divider switching points on one of the phase generators so that its output signal leads or lags the output signal of the other phase generator by 90°. These orthogonal signals can be supplied to the low frequency input ports of a single side band modulator of the kind which use 90° phase shifted signals to cancel the undesired side band.

BRIEF DESCRIPTION OF THE DRAWINGS

The invention will be better understood, and further objects, features, and advantages thereof will become more apparent from the following description of preferred embodiments, taken in conjunction with the accompanying drawings in which.

DESCRIPTION OF PREFERRED EMBODIMENTS

Figure 1:
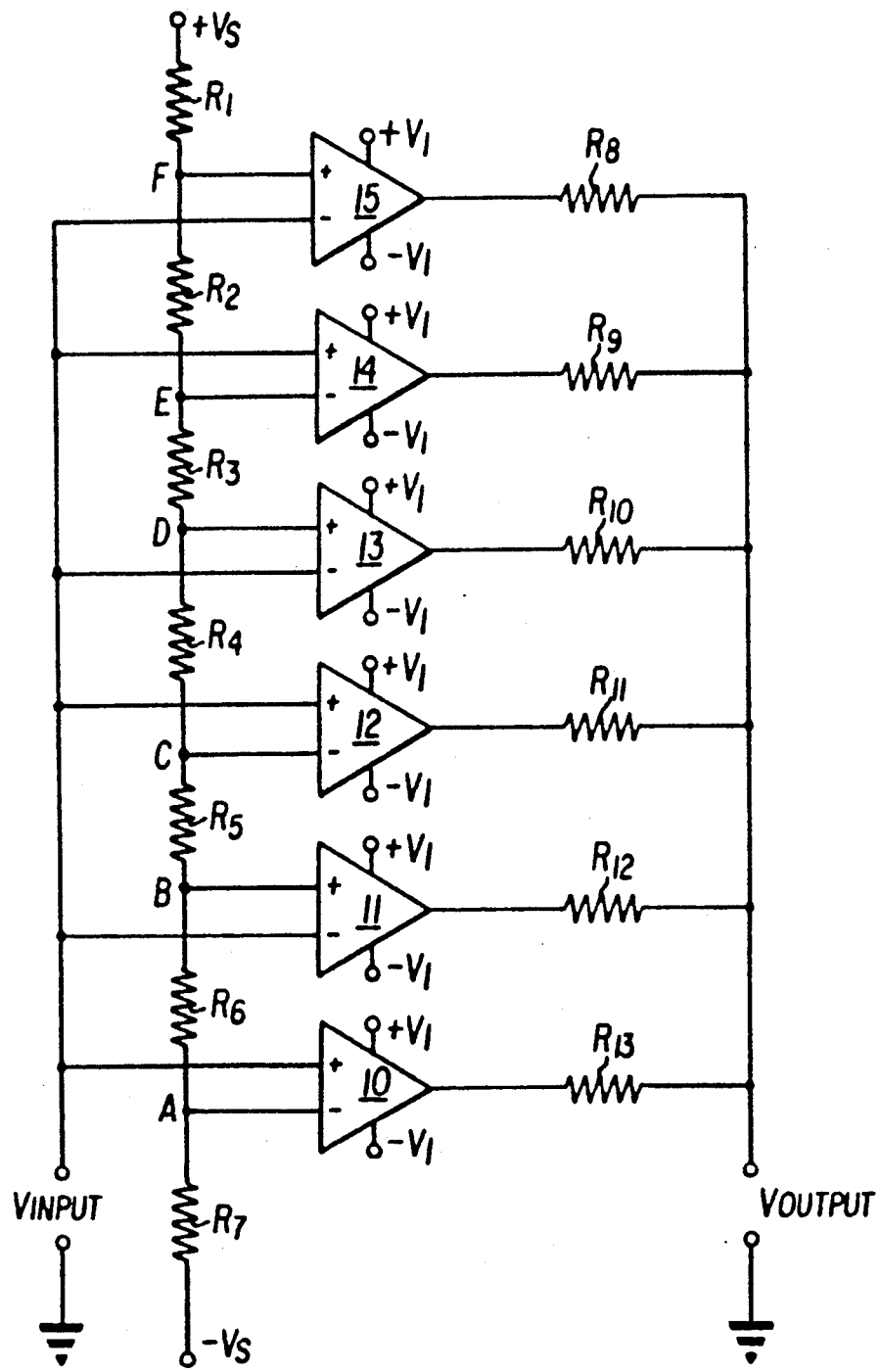
FIG. 1 is an electrical schematic diagram of a phase generator according to the invention.

Referring now to FIG. 1, resistors $R_1$-$R_7$ are connected in series across an impressed voltage represented by $+V_S$ and $-V_S$ to form a voltage divider which divides the impressed voltage betweeen each successive resistor. The nodes A-F between the resistors $R_1$-$R_7$ are designated such that node B is at a more positive voltage than node A, node C is at a more positive voltage than node B, et cetera. Resistors $R_1$-$R_7$ are identical so that the voltages between successive nodes A-F are equal.

Operational amplifiers 10-15 are connected to voltage divider $R_1$-$R_7$, with each successive node being connected to a successive operational amplifier. For example, node F is connected to the positive input of operational amplifier 15, node E is connected to the negative input of operational amplifier 14, etc. An input voltage $V_{IN}$ is applied to the other alternate inputs of the operational amplifiers 10-15, i. e., $V_{IN}$ is applied to the negative input of operational amplifier 15, to the positive input of operational amplifier 14, etc. This method of connection causes the operational amplifiers 10-15 to act as alternate inversion, non-inversion amplifiers. The output of an operational amplifier depends upon how the amplifier is biased and the voltage relationship between the positive and negative inputs. With nodes A-F at fixed voltages determined by the voltage divider $R_1$-$R_7$ and the voltages $+V_S$ and $-V_S$, the instantaneous input voltage $V_{IN}$ then determines the switching point of each operational amplifier. The resistors $R_8$-$R_{13}$ form an adding network which combines the individual outputs of the operational amplifiers 10-15 into a single output $V_{OUT}$. Each time the input voltage $V_{IN}$ changes by an increment equal to the voltage between adjacent nodes, the phase of the output voltage $V_{OUT}$ changes by 180°.

The operational amplifiers 10-15 differ from the equivalent operational amplifiers in the rectangle function generator described in the above-referenced U.S.

Pat. No. 4,375,082 in that these amplifiers 10–15 have a sinusoidal transition characteristic so that the output of the phase generator described herein is a sinusoid rather than a rectangle function. For example, this sinusoidal transition characteristic can be achieved by employing biased diodes in the operation amplifiers 10–15.

The relationship between the input voltage $V_{IN}$ and the output voltage $V_{OUT}$ is expressed by the following equation:

$$V_{OUT} = a_1 \sin(2\pi V_{IN}/V_a)$$

where $a_1$ is a fixed constant, and $V_a$ is a fixed reference voltage.

Figure 2:
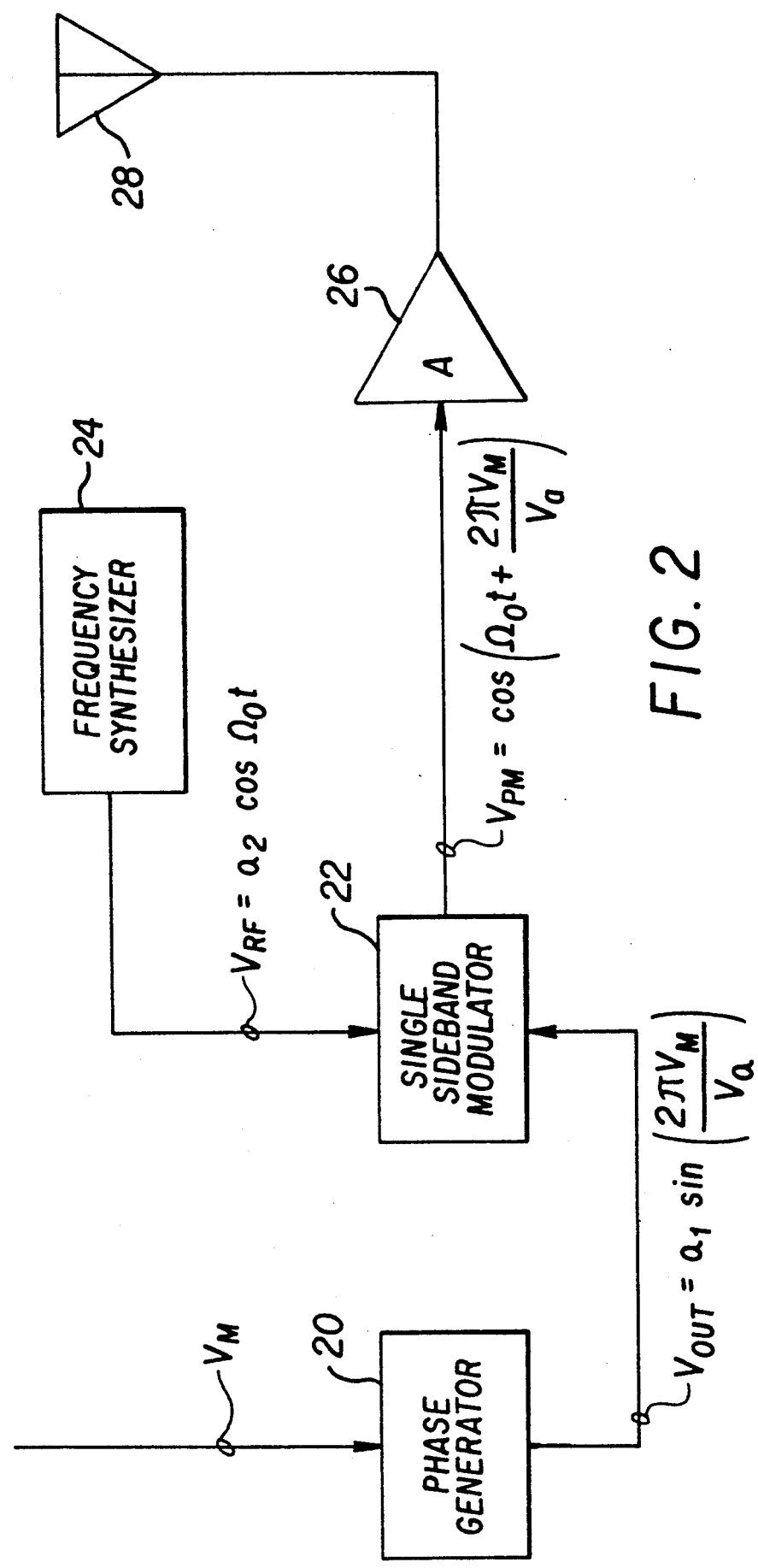
FIG. 2 is an electrical block diagram of a first embodiment of the invention.

A phase generator similar to that of FIG. 1 can be used to phase modulate an r. f. carrier signal in accordance with a varying modulation signal $V_M$, as shown in FIG. 2. Of course, for many applications, several hundred switching elements such as the operational amplifiers 10–15 may be required in the phase generator circuit. For example, assuming each switching element generates approximately three radians of phase, for a voice FM system with plus or minus 75 kHz deviation and 100 Hz lowest base band frequency, maximum 75000/100 = plus or minus 750 radians are required, or a total of 500 switching elements.

In FIG. 2, the modulation signal $V_M$ is the input signal $V_{IN}$ to the phase generator 20, and the output signal $V_{OUT}$ of the phase generator 20, equal to $a_1 \sin (2\pi V_M/V_a)$, is supplied to the low frequency port of a conventional single side band (SSB) modulator 22. A frequency synthesizer 24 generates an r. f. carrier signal $V_{RF}$, e.g. 150 MHz, equal to $a_2 \cos \Omega_o t$ where $a_2$ is a fixed constant. The r. f. carrier signal $V_{RF}$ is supplied to the r. f. input port of the SSB modulator 22. The phase of the output $V_{PM}$ of the SSB modulator 22 is the sum (or difference) of the two input signals, that is, $$V_{PM} = \cos(\Omega_o t + 2\pi V_M/V_a)$$

The modulator output $V_{FM}$ is amplified by amplifier 26 and supplied to an antenna 28.

Figure 3:
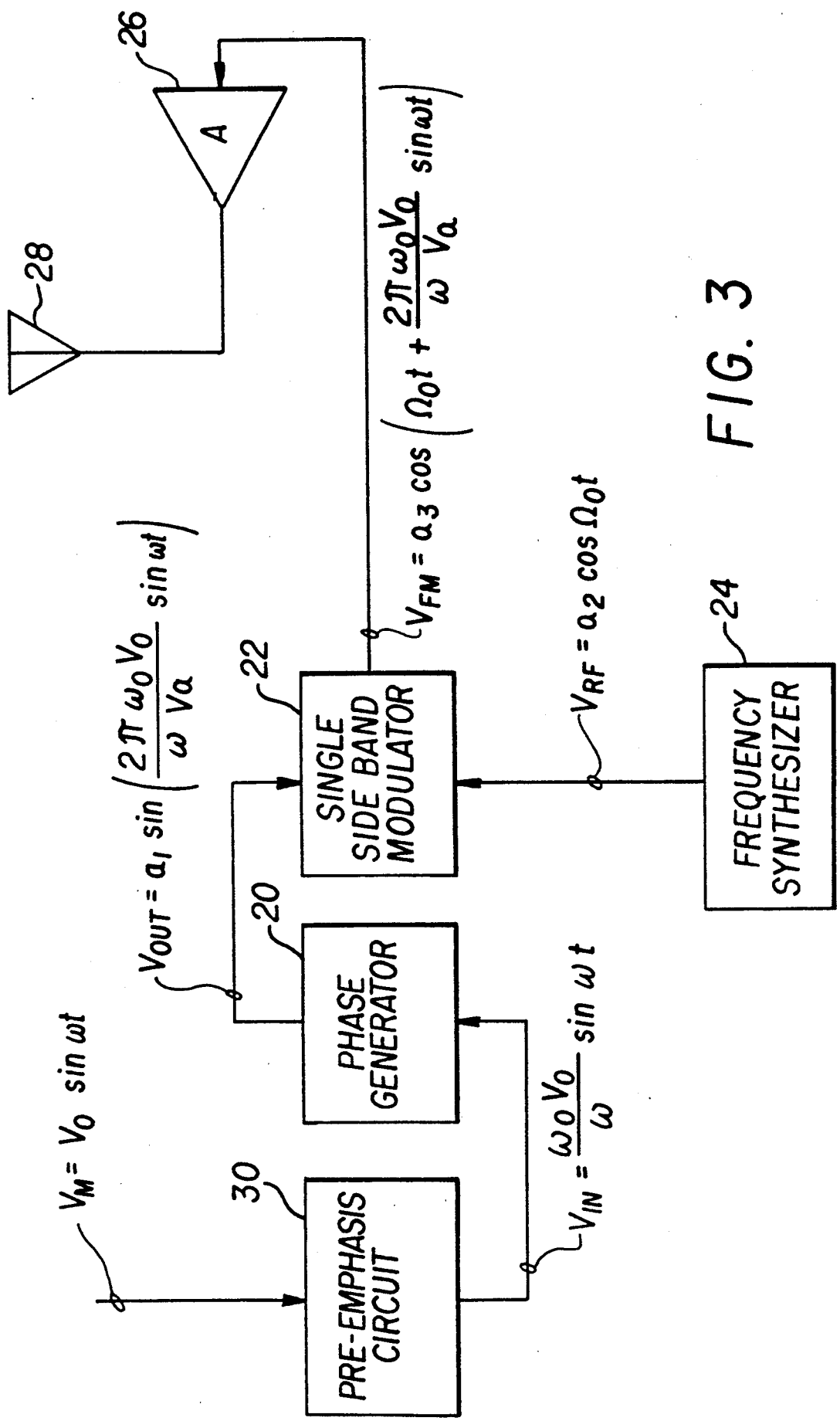
FIG. 3 is an electrical block diagram of a second embodiment of the invention.

The phase generator 20 can also be used to frequency modulate an r. f. carrier signal in accordance with a varying modulation signal $V_M$, as shown in FIG. 3. The modulating scheme shown in FIG. 3 is the same as that of FIG. 2 with the addition of a pre-emphasis circuit 30 ahead of the phase generator 20 to emphasize the low frequencies in the spectrum of the modulating voltage $V_M$ supplied to it. This causes the frequency of the output signal of the SSB modulator 22 to be proportional to the modulating signal $V_M$, as is required for frequency modulation. Pre-emphasis circuits are generally very simple, and could consist of only a resistor and a capacitor. The output voltage of the pre-emphasis circuit 30 is the input voltage $V_{IN}$ of the phase generator 20 wherein $$V_{IN} = (\omega_o/\omega) V_o \sin \omega t.$$

The output voltage of the phase generator 20 is $$V_{OUT} = a_1 \sin[2\pi(\omega_o/\omega)(V_o/V_a) \sin \omega t]$$

which is supplied to the low frequency port of the SSB modulator 22. The r. f. carrier signal $V_{RF} = a_2 \cos \Omega_o t$ generated by the frequency synthesizer 24 is supplied to the r. f. input port of SSB modulator 22. The phase of the modulated output $V_{FM}$ of SSB modulator 22 is the sum of the phases of the two input voltages $V_{OUT}$ and $V_{RF}$, that is, $$V_{FM} = a_3 \cos[\Omega_o t + 2\pi(\omega_o/\omega)(V_o/V_a) \sin \omega t]$$

The instantaneous frequency $\Omega_1$ of this signal $V_{FM}$ is $$\Omega_1 = d\phi/dt = \Omega_o + 2\pi\omega_o(V_o/V_a) \cos \omega t$$

with the maximum deviation being $2\pi\omega_o(V_o/V_a)$ and the modulation index M being $2\pi(\omega_o/\omega)(V_o/V_a)$.

Figure 4:
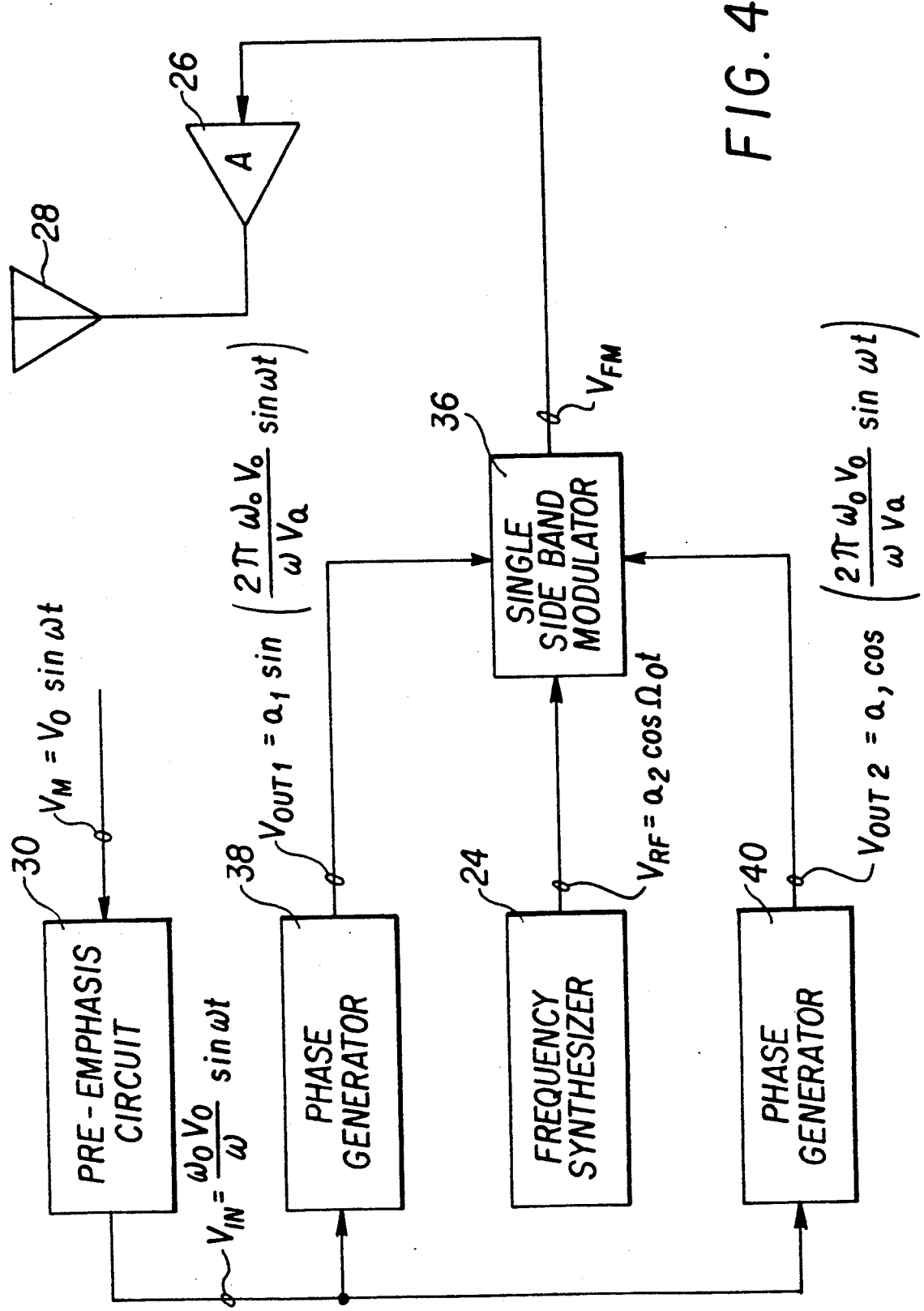
FIG. 4 is an electrical block diagram of a third embodiment of the invention.

The modulation scheme of FIG. 4 is similiar to that of FIG. 3, except it includes a SSB modulator 36 of the type which use two low frequency input signals, phase-shifted 90° from each other, rather than an SSB modulator 22 having a single low frequency input. The output voltage of the pre-emphasis circuit 30 is the input voltage $V_{IN}$ of two phase generators 38 and 40 which are similar to the phase generator of FIG. 1. The resistors forming the voltage dividers in the two phase generators 38, 40 are selected or adjusted such that the output voltages of these two phase generators 38, 40 are orthogonal, that is, shifted in phase by 90° relative to one another. For example, if all of the resistors in these voltage dividers are equal, the output voltage of phase generator 38 can be made orthogonal to the output voltage of phase generator 40 by adjusting the first resistor of phase generator 38 to be half its initial value and the last resistor of phase generator 38 to be 50 percent greater than its initial value. The two output voltages of the phase generators 38, 40 are supplied to the two low frequency input ports, respectively, of the SSB modulator 36. The frequency modulated output voltage $V_{fm}$ of SSB modulator 36 is the same as that given above for the output $V_{FM}$ of SSB modulator 22 above.

Since there are many variations, additions, and substitutions to the preferred embodiments described above which would be obvious to one skilled in the art, it is intended that the scope of the invention be limited only by the appended claims.

What is claimed and desired to be secured by Letters Patent of the United States is:

1. Signal modulation apparatus for modulating an r. f. carrier signal, comprising:
   a first phase generator, connected to receive a first varying voltage signal, for generating an output signal having a phase proportional to the amplitude of the first varying signal, wherein the first phase generator comprises
   a plurality of amplifiers for generating amplifier output voltages which are switched between two voltage levels in accordance with the first varying signal and a like plurality of fixed voltages supplied respectively to the amplifiers, each amplifier output voltage being switched to one voltage level whenever the first varying signal rises above the fixed voltage supplied to the amplifier and each amplifier being switched to the other voltage level whenever the first varying voltage falls below the fixed voltage supplied to the amplifier,
   fixed voltage generating means for generating the fixed voltages supplied respectively to the amplifiers, and
   summing means for summing the amplifier output voltages to generate the phase generator output signal, wherein the amplifiers are connected to receive the first varying signal and the respective fixed voltages and to supply the amplifier output voltages to the summing means as alternately arranged inversion and non-inversion amplifiers so that, in each pair of amplifiers receiving adjacent fixed voltages, one amplifier is connected as an inversion amplifier and the other amplifier is connected as a non-inversion amplifier; and modulating means, connected to receive the r. f. carrier signal and the output signal of the first phase generator, for combining the received signals to produce a modulated carrier signal having a phase proportional to the amplitude of the first varying signal.

2. Signal modulation apparatus, as described in claim 1, wherein:

the modulating means comprises a single side band modulator having two input ports which respectively require two modulation signals that are 90° out of phase; and the signal modulation apparatus further comprises a second phase generator which is connected to receive the first varying voltage signal and which is identical to the first phase generator except the fixed voltages supplied to the respective amplifiers of the second phase generator differ from the fixed voltages supplied to the respective amplifiers of the first phase generator such that the output signal of the second phase generator is 90° out of phase with the output signal of the first phase generator, the two phase generator output signals being supplied respectively to the two input ports of the single side band modulator.

3. Signal modulation apparatus, as described in claim 2, which further comprises pre-emphasis circuit means having an input connected to receive a second varying signal and an output, for emphasizing low frequencies in the spectrum of the second varying signal, the output signal of the pre-emphasis circuit means constituting the first varying voltage signal supplied to the first and second phase generators, whereby the modulated carrier signal produced by the modulating means has a frequency proportional to the frequency of the second varying voltage signal.

4. Signal modulation apparatus, as described in claim 1, which further comprises pre-emphasis circuit means having an input connected to receive a second varying signal and an output, for emphasizing low frequencies in the spectrum of the second varying signal, the output signal of the pre-emphasis circuit means constituting the first varying voltage signal supplied to the first phase generator, whereby the modulated carrier signal produced by the modulating means has a frequency proportional to the frequency of the second varying voltage signal.

5. Signal modulation apparatus for modulating an r. f. carrier signal, comprising:

a pre-emphasis circuit, connected to receive a first varying voltage signal, for producing a second varying voltage signal which varies as a function of the frequency of the first varying voltage signal;

a first phase generator, connected to receive the second varying voltage signal, for generating an output signal having a phase proportional to the amplitude of the second varying voltage signal, wherein the first phase generator comprises a plurality of amplifiers for generating amplifier output voltages which are switched between two voltage levels in accordance with the second varying voltage signal and a like plurality of fixed voltages supplied respectively to the amplifiers, each amplifier output voltage being switched to one voltage level whenever the second varying voltage signal rises above the fixed voltage supplied to the amplifier and each amplifier being switched to the other voltage level whenever the second varying voltage signal falls below the fixed voltage supplied to the amplifier, fixed voltage generating means for generating the fixed voltages supplied respectively to the amplifiers, and summing means for summing the amplifier output voltages to generate the phase generator output signal, wherein the amplifiers are connected to receive the second varying voltage signal and the respective fixed voltages and to supply the amplifier output voltages to the summing means as alternately arranged inversion and non-inversion amplifiers so that, in each pair of amplifiers receiving adjacent fixed voltages, one amplifier is connected as an inversion amplifier and the other amplifier is connected as a non-inversion amplifier; and modulating means, connected to receive the r. f. carrier signal and the output signal of the first phase generator, for combining the received signals to produce a modulated carrier signal having a frequency which varies as a function of the first varying voltage signal.

6. Signal modulation apparatus, as described in claim 5, wherein:

the modulating means comprises a single side band modulator having two input ports which respectively require two modulation signals that are 90° out of phase; and the signal modulation apparatus further comprises a second phase generator which is connected to receive the second varying voltage signal and which is identical to the first phase generator except the fixed voltages supplied to the respective amplifiers of the second phase generator differ from the fixed voltages supplied to the respective amplifiers of the first phase generator such that the output signal of the second phase generator is 90° out of phase with the output signal of the first phase generator, the two phase generator output signals being supplied respectively to the two input ports of the single side band modulator.

7. Signal modulation apparatus for modulating an r. f. carrier signal, comprising:

two phase generators, each connected to receive a first varying voltage signal, for generating orthogonal output signals each having a phase proportional to the amplitude of the first varying signal, wherein each of the two phase generators comprises a plurality of amplifiers for generating amplifier output voltages which are switched between two voltage levels in accordance with the first varying signal and a like plurality of fixed voltages supplied respectively to the amplifiers, each amplifier output voltage being switched to one voltage level whenever the first varying signal rises above the fixed voltage supplied to the amplifier and each amplifier being switched to the other voltage level whenever the first varying signal falls below the fixed voltage supplied to the amplifier, fixed voltage generating means for generating the fixed voltages supplied respectively to the amplifiers, and summing means for summing the amplifier output voltages to generate the phase generator output signal, wherein the amplifiers are connected to receive the first varying signal and the respective fixed voltages and to supply the amplifier output voltages to the summing means as alternately arranged inversion and non-inversion amplifiers so that, in each pair of amplifiers receiving adjacent fixed voltages, one amplifier is connected as an inversion amplifier and the other amplifier is connected as a non-inversion amplifier, wherein the fixed voltages suppied to one phase generator differ from the fixed voltages supplied to the other phase generator such that the output signal of the one phase generator is 90° out of phase with the output of the other phase generator; and a single side band modulator, which is connected to received the two orthogonal phase generator output signals, respectively, and to receive the r. f. carrier signal, for combining the received signals to produce a modulated carrier signal having a phase which varies as a function of the amplitude of the first varying signal.

8. Signal modulation apparatus, as described in claim 7, which further comprises:

a pre-emphasis circuit, connected to receive a second varying voltage signal, for producing an output signal which varies as a function of the frequency of the second varying voltage signal and which constitutes the first varying voltage signal supplied to the two phase generators, whereby the modulated carrier signal produced by the single side band modulator has a frequency which varies as a function of the second varying voltage signal.

* * * * *